United States Patent [19]
Gray et al.

[11] Patent Number: 5,880,973
[45] Date of Patent: Mar. 9, 1999

[54] SIGNAL PROCESSING SYSTEM AND METHOD FOR ENHANCED CASCADED INTEGRATOR-COMB INTERPOLATION FILTER STABILIZATION

[75] Inventors: Joseph Harold Gray, Palo Alto; Lars Morten Jorgensen, San Jose, both of Calif.

[73] Assignee: Graychip Inc., Palo Alto, Calif.

[21] Appl. No.: 752,154

[22] Filed: Nov. 20, 1996

[51] Int. Cl.⁶ .................................................. G06F 7/38
[52] U.S. Cl. .............. 364/572; 364/724.11; 364/724.03; 364/724.1; 375/350
[58] Field of Search ............................... 364/572, 724.01, 364/724.03, 724.06, 724.09, 724.1, 724.11; 375/350, 346, 349

[56] References Cited

U.S. PATENT DOCUMENTS

| | | | |
|---|---|---|---|
| 4,223,389 | 9/1980 | Amada et al. ........................... 364/724 |
| 5,043,933 | 8/1991 | Boutaud et al. ....................... 364/724.1 |
| 5,150,318 | 9/1992 | Kontani et al. ..................... 364/724.01 |
| 5,227,991 | 7/1993 | Lay ..................... 364/724.03 |
| 5,412,352 | 5/1995 | Graham ..................................... 332/103 |
| 5,463,569 | 10/1995 | Staver et al. .......................... 364/724.1 |
| 5,519,732 | 5/1996 | Chester ..................... 375/295 |
| 5,541,864 | 7/1996 | Van Bavel et al. .................. 364/724.1 |
| 5,592,517 | 1/1997 | Camp et al. ............................. 375/350 |
| 5,596,609 | 1/1997 | Genrich et al. ......................... 375/350 |
| 5,703,596 | 12/1997 | White ..................................... 342/194 |

FOREIGN PATENT DOCUMENTS

57132268/
56017658 8/1982 Japan .............................. G06F 15/31

OTHER PUBLICATIONS

Eugene B. Hogenauer, Member, IEEE, An Economical Class of Digital Filters for Decimation and Interpolation, IEEE Transactions on Acoustics, Speech and Signal Processing, vol. ASSP–29, No. 2, Apr. 1981, pp. 155–162.

Ronald E. Crochiere, Senior Member, IEEE, and Lawrence R. Rabiner, Fellow, IEEE, Interpolation and Decimation of Digital Signals—A Tutorial Review, Proceedings of the IEEE, vol. 69, No. 3, Mar. 1981, pp. 300–331.

Hogenauer, E.B., "An Economical Class of Digital Filters for Decimation and Interpolation," *IEEE Trans.* ASSP–29:2, Apr. 1981, pp. 155–162.

*Primary Examiner*—James P. Trammell
*Assistant Examiner*—Bryan Bui
*Attorney, Agent, or Firm*—Howrey & Simon

[57] ABSTRACT

A signal processing system and method for stabilizing cascaded integrator-comb (CIC) interpolation filters. The signal processing system includes an overflow detection circuit and reset circuitry. The overflow detection circuit monitors the output of the CIC interpolation filter for an overflow condition which is indicative of filter instability. When an overflow condition is detected, the reset circuitry automatically resets the filter, thereby eliminating the instability.

23 Claims, 9 Drawing Sheets

SIGNAL PROCESSING SYSTEM AND METHOD FOR ENHANCED CASCADED INTEGRATOR-COMB INTERPOLATION FILTER STABILIZATION

BACKGROUND OF THE INVENTION

1. Field of the Invention

The invention relates to signal processors. More particularly, the invention relates to signal processing systems and methods with cascaded integrator-comb interpolation filters.

2. Description of Related Art

Significant advancements in digital signal processing are due largely to advancements in integrated-circuit fabrication and digital computer technology. That is, the rapid developments in integrated-circuit technology, particularly very-large-scale integration (VLSI) of electronic circuits, have lead to the development of powerful and inexpensive digital computers and special-purpose digital hardware. These inexpensive and relatively fast digital systems are capable of performing complex digital signal processing techniques, which are usually too difficult and/or too expensive to be performed by analog circuitry or analog signal processing systems.

As such, digital signal processing is now commonly employed in a wide variety of applications including communication systems (e.g., cellular, wireless, and radar systems), image processing, and speech processing.

Sample rate conversion techniques (or processes) are typically performed by digital processing systems. In general, such techniques digitally convert the sample rate of a signal to a different rate. When the converted sample rate is lower than the original sampling rate, the process is called decimation. When the converted sample rate is higher, the process is called interpolation. In effect, decimation reduces the number of samples, whereas interpolation creates additional samples of an original signal from a reduced set of samples.

Interpolation is required in systems such as digital transmitters where the signal to be transmitted, at a given carrier frequency, must be sampled at a rate which is at least twice the frequency of a carrier signal. For example, speech—which is typically sampled at 8,000 samples per second (8 KHz)—must be interpolated up to a sample rate of 50 million samples per second (50 MHz) before it can be modulated to carrier frequencies up to 25 million cycles per second (25 MHz).

Conventionally, signal processors have utilized a wide variety of interpolation filters to achieve this end. An efficient interpolation filter for this purpose was described in an article by Eugene B. Hogenhauer, "An Economical Class of Digital Filters for Decimation and Interpolation," IEEE Transactions on Acoustics, Speech and Signal Processing, Vol. ASSP 29, No. 2, April 1981. The filter disclosed in the Hogenhauer article is called a cascaded integrator-comb (CIC) interpolation filter. The CIC interpolator filter represented a significant advancement in the art and has since become the filter of choice for many applications.

CIC interpolation filters are constructed as a series of "N" comb filter circuits (subtractors), followed by a zero pad circuit, followed by a series of "N" integrator circuits (adders). The comb section of the filter operates at a low sample rate, whereas the integrator section of the filter operates at a high sampling rate. Typically, the interpolation factor (R) is set between 2 and 10,000. The number of stages (N) is selected according to the desired level of accuracy. The lowest practical number of stages commonly employed today is 3 (lowest accuracy) and the highest is 5 (highest accuracy). Typical filters have 4 stages.

In operation, each comb circuit outputs the difference between its current input sample and its previous input sample. The zero pad circuit outputs the current input sample followed by "R−1" zero samples. Each integrator circuit outputs the sum of its current input sample with its previous output sample. The output of the last integrator stage is the interpolated output of the CIC interpolation filter.

Implementing a CIC interpolation filter generally involves the following three requirements: 1) the filter must be reset before use; 2) addition and subtractions must be performed using modulo arithmetic; and 3) the word size in the subtracters, adders, and storage elements must be large enough to accommodate the arithmetic gain of the filter. The first requirement is typically satisfied by clearing all storage elements before use. The second requirement is satisfied by using sign-2's-complement arithmetic. With respect to the third requirement, the Hogenhauer article disclosed that the requirement is satisfied if the last integrator stage can accommodate at least a sample (word) size of $B_{out}$ bits, where $B_{out}=(B_{in}+\log_2 R^{(N-1)})$, $B_{in}$ is the number of bits per input sample, and R is the interpolation factor. In other words, the output of the last integrator stage (and thus the filter) must be able to accommodate an amplitude gain of $R^{(N-1)}$.

There are many significant advantages of CIC interpolation filters including that: no multipliers are required (i.e., processing is done with simple subtraction and addition functions); no storage is required for filter coefficients or large blocks of input samples; the structure of the filter is very "regular," primarily consisting of two basic building blocks (comb filters and integrators); little external control or complicated local timing is required; and the same filter design can easily be used for a wide range of applications. For example, CIC interpolation filters require only "N" comb filters, "N" integrators, and "2N" storage elements to interpolate by very large amounts. This contrasts with other interpolation systems and methods that generally require at least $\log_2 R$ multipliers and adders. See Crochier et al., "Interpolation and Decimation of Digital Signals-A Tutorial Review," Proceedings of the IEEE, Vol. 69, No. 3, March 1981.

When properly designed and initialized, CIC interpolation filters are considerably stable and can process, without error, for extended periods of time. That is, the combination of the comb filters and the integrator allow the CIC interpolation filter to continuously operate in its intended manner.

Conventional CIC interpolation filters, however, have sustained disadvantages. That is, a change in filter parameters (e.g., the interpolation factor "R")or the interjection of circuit noise causes unbounded growth, thereby rendering the CIC interpolation filter unstable. In general, there is a processing balance between the comb and integrator sections of the filter, such that processed output samples of the filter remain within predetermined amplitude thresholds or limits. In other words, input samples are preconditioned by the comb section so that amplitude overflows do not occur in the integrator sections. When the parameters are changed or noise is interjected, variances (or errors) in samples being processed occur. These variances, in turn, are further acerbated, typically without bound, by the integrators.

Once a conventional CIC interpolation filter becomes unstable it must be manually reset. As a practical matter, instability caused by the changing of filter parameters is not a significant problem because the change is initiated by the application (or user); the application "knows" that the filter becomes unstable at the time of such change. Accordingly, a properly designed application will merely reset the filter after it changes the parameters.

Circuit noise, however, is random, caused for example by fluctuations in electrical power sources, atmospheric disturbances (such as lightening, physical shock, high energy radiation particles), or other unpredictable events. Since these events are infrequent and hard to detect, an application is typically designed to wait until a complete system failure occurs, determine if the failure is due to a CIC interpolation filter instability, and only then reset the filter. For example, in a wireless communication application this type of instability, albeit infrequent, is catastrophic in that the channel is completely lost requiring the user to initiate another connection. Indeed, the instability problem may cause such bandwidth growth that would affect other channels in the cellular system.

Another example, where the instability of conventional CIC interpolation filters is a major problem which prevents their use, is in satellites where high energy radiation particles are common. Furthermore, in such a space- and energy-constrained application, the provision of any additional circuitry that might otherwise be required to monitor for instability would be costly and undesirable.

SUMMARY OF THE INVENTION

The invention meets the above needs, and overcomes the disadvantages and drawbacks of conventional CIC interpolation filters. The invention teaches a system and method of automatically detecting instabilities and resetting a CIC interpolation filter when instabilities are detected.

The invention detects instabilities in the CIC interpolation filter by continuously monitoring the output samples of the filter. Under normal conditions, the output sample of the last stage of the filter should never exceed a predetermined threshold governed by $A(R^{(N-1)})$, where A is the amplitude (magnitude) of the input sample. As such, only $(B_{in}+\log_2 R^{(N-1)})$ bits of precision are necessary for the final integrator circuit in a CIC interpolation filter. In an unstable condition, output samples exceed this predetermined threshold.

The invention exploits this instability characteristic of CIC interpolation filters. That is, the invention monitors and detects output samples with amplitudes that exceed $A(R^{(N-1)})$ (and correspondingly, require more than $(B_{in}+\log_2 R^{(N-1)})$ bits to represent). Those samples which have such amplitudes are called overflow samples. Once the presence of an overflow sample is detected, the invention automatically resets the CIC interpolation filter.

One prominent advantage of the invention is that instability detection is achieved quickly, since each output sample of the CIC interpolation filter is checked. Thus, erroneous data is not propagated throughout the overall system for an unnecessarily protracted period of time.

Correspondingly, another significant advantage of the invention is that it provides automatic and ensured recovery by resetting the CIC interpolation filter upon the detection of filter instability.

A further advantage is that embodiments of the invention are very cost effective to implement. For example, one integrated circuit embodiment of the invention requires less than twenty CMOS gates. Moreover, the invention is likely to realize reductions in overall system design and operating costs. For example, in cellular systems where large numbers of signals are being transmitted, this cost effective solution to the CIC filter instability problem will decrease the overall cost of cellular equipment.

An additional advantage of the invention is that it can be readily implemented and integrated into a wide variety of existing CIC interpolation filter designs.

The foregoing, and other features and advantages of the invention, will be apparent from the following, more particular description of the preferred embodiments of the invention, the accompanying drawings, and the appended claims.

DETAILED DESCRIPTION OF THE PREFERRED EMBODIMENTS

The preferred embodiments of the invention are now described with reference to the figures where like reference numbers indicate like elements. Also in the figures, the left most digit of each reference number corresponds to the figure in which the reference number is first used.

Figure 1:
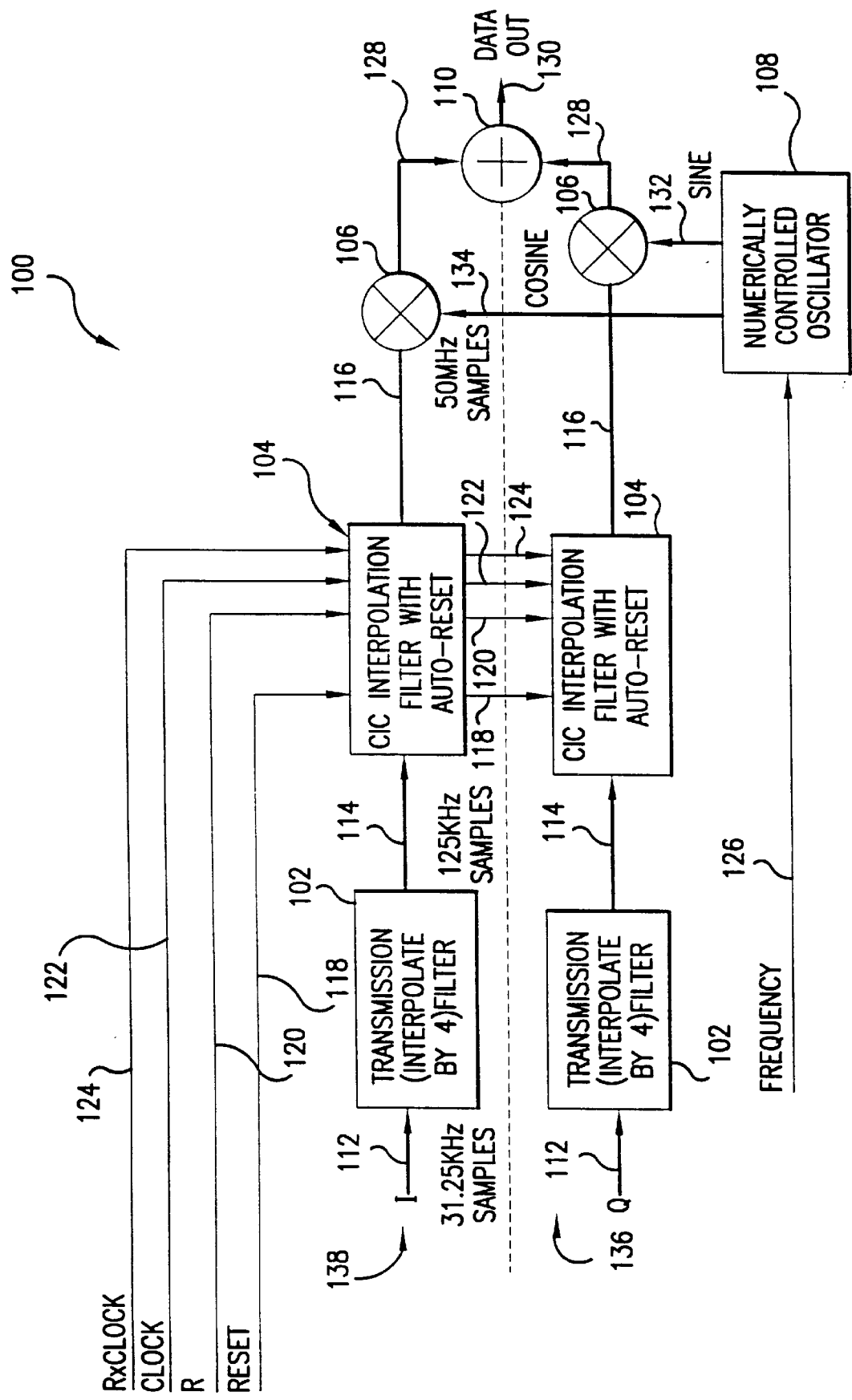
FIG. 1 is a high level block diagram of a signal processor (or digital transmit circuit) 100 in accordance with the principles of the invention.

FIG. 1 is a high level block diagram of a signal processor 100 (alternatively referred to as digital transmit circuit 100) in accordance with the principles of the invention. More particularly, FIG. 1 illustrates one of the four transmit circuits that is to be contained in a GRAYCHIP™GC4114 Quad Transmit chip, which is specifically designed for use in cellular communication systems. The GRAYCHIP™GC4114 Quad Transmit chip is the first version of this product to include an embodiment of the invention and will be commercially available from GRAY-CHIP Inc., 2185 Park Boulevard, Palo Alto, Calif. 94306, the assignee of this patent application.

In general, digital transmit circuit 100 can be utilized in a number of communication applications. For example, digital transmit circuit 100 can be used with cellular radios to modulate a narrowband voice signal and up-convert the signal to a desired center carrier frequency. When multiple digital transmit circuits 100 are used to modulate multiple voice signals, each digital transmit circuit 100 up-converts its signal to a unique center carrier frequency. The output of each digital transmit circuit 100 is then added together to produce a wideband signal. Correspondingly, the wideband signal includes all the constitute voice channels, each at a different frequency. In such cellular applications, the wideband signal is then converted from digital samples to analog voltages and up-converted to a 800 MHz cellular frequency band.

As illustrated in FIG. 1, digital transmit circuit 100 is partitioned into two identical segments 136, 138, which respectively process the complex sample components (real (Q) and imaginary (I)) of a signal. Each channel includes a transmission (interpolate by four) filter 102, a cascaded integrator-comb (CIC) interpolation filter 104, and a mixer 106. Transmission filter 102, CIC interpolation filter 104, and mixer 106 receive and send samples over data buses 112, 114, and 116, respectively, as illustrated in FIG. 1. Digital transmit circuit 100 also includes a numerically controlled oscillator (NCO) 108 and an output combiner (summer) 110. NCO 108 is programmed by the communication system over a frequency data bus 126.

In this preferred embodiment, digital transmit circuit 100 receives (over data bus 112) input samples from a communication system (not shown). The communication system, in one embodiment, may be a U.S. cellular base station which uses the Advanced Mobile Phone Systems (AMPS) communication standard. As such, the input samples have been modulated, via Frequency Modulation (FM), and are presented to digital transmit circuit 100 at an input sample rate of 31,250 samples per second (31.25 KHz). The input rate is a design criteria and thus will vary significantly among different applications. For example, when utilized with cellular systems that use Differential Phase Shift Keying (DPSK) or Quadrature Phase Shift Keying (QPSK) modulation, the input sample rate would be approximately 200 KHz.

The overall function of digital transmit circuit 100 is to increase the input sample rate (associated with the samples on bus 112) to a higher rate that is at least twice the desired center carrier frequency of the up-converted signal. As illustrated in FIG. 1, the higher sample rate (associated with the samples on bus 116), in this embodiment, is 50 MHz, thus allowing center carrier frequencies of up to 25 MHz. To achieve this end, digital transmit circuit 100 interpolates the 31.25 KHz input samples, by a factor of 1600, in order to create the 50 MHz sampled version of the signal.

Transmission filter 102 first interpolates the input samples (31.5 MHz samples on bus 112) by a factor of 4, as well as shapes the spectral response. In general, implementation of transmission filter 102 is well known in the art. For example, a conventional finite impulse response (FIR) filter, with one or two stages, can be used. With respect to a QPSK-based cellular system, transmission filter 102 can be implemented as a conventional root-raised cosine (RRC) pulse shaping filter. In this embodiment, however, transmission filter 102 is a low-pass filter with a 30 KHz cut-off frequency. Transmission filter 102 also has two stages (not shown). In a presently preferred embodiment, the first stage is a sixty-three tap, interpolate by two, filter followed by the second stage that is a thirty-one tap, interpolate by two, filter. Additionally, the first stage filter is programmable to allow for the selection of filter shapes (e.g., low-pass or RRC). Other arrangements of filter 102 may be employed without departing from the spirit or scope of the present invention, however.

Once input samples have been interpolated by a factor of four, CIC interpolation filter 104 interpolates the samples (125 KHz samples on bus 114) by an additional factor of 400, thereby achieving the desired sampling gain of 1600 (i.e., equal to 4*400). Accordingly, CIC interpolation filter 104 outputs samples at 50 MHz onto bus 116. These samples (at 50 MHz) are then sent to mixer 106 and multiplied by a sine output 132 (or a cosine output 134) of NCO 108 to up-convert to the desired center carrier frequency. The resulting samples (on bus 128) of each channel are sent to output combiner 110 that sends the processed output samples to the communication system to transmission.

As illustrated in FIG. 1, CIC interpolation filter 104 receives a system reset signal 118, a clock signal 122, a Rxclock signal 124, and interpolation factor data (R) (over bus 120) from the communication system. System reset signal 118 is controlled by the communication system to force a reset condition, such as after the changing of the interpolation factor "R". In this embodiment, clock 122 is a 125 KHz free running clock. The frequency of clock 122 corresponds with the rate of the samples on bus 114. Rxclock 124 is also a free running clock that operates at a frequency "R" times greater than that of clock 122 (50 MHz), which corresponds with the rate of the samples on bus 116.

Figure 2:
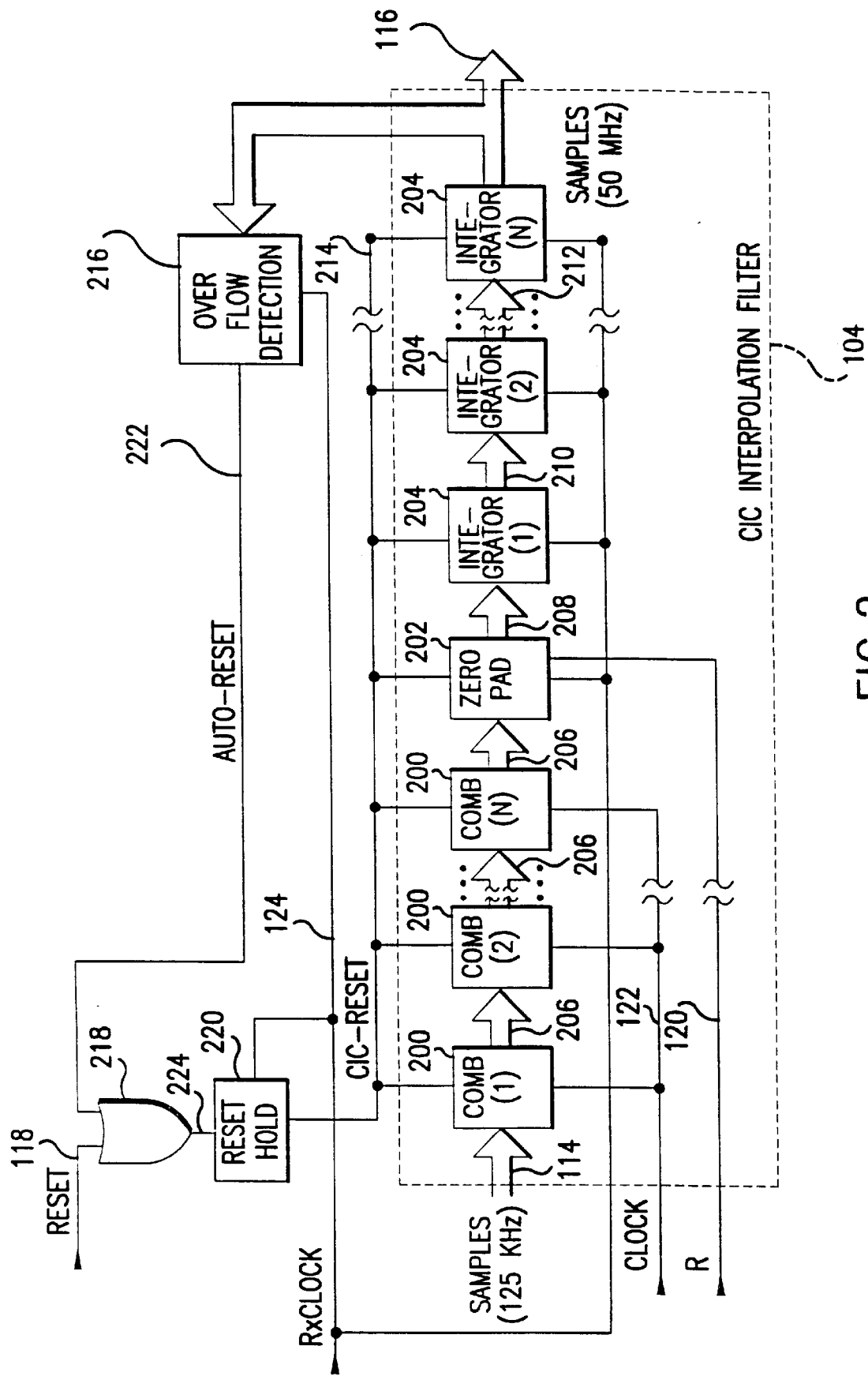
FIG. 2 is a detailed block diagram of a cascaded integrator-comb (CIC) interpolation filter 104 in accordance with the principles of the invention.

FIG. 2 illustrates a detailed block diagram of CIC interpolation filter 104 in accordance with the principles of the invention. CIC interpolation filter 104 includes "N" number of comb filters 200, a zero pad circuit 202, and "N" number of integrator circuits 204. There are an equal number (N) of stages, each stage having one comb filter 200 and one integrator circuits 204. In general, the lowest practical number of stages is 3 (lowest accuracy) and the highest is 5 (highest accuracy). In this embodiment N=4. Comb filters 200, zero pad circuit 202, and integrator circuits 204 are generally implemented in accordance with the article by Eugene B. Hogenhauer, "An Economical Class of Digital Filters for Decimation and Interpolation," IEEE Transactions on Acoustics, Speech and Signal Processing, Vol. ASSP 29, No. 2, April 1981, the disclosure of which is herein by incorporated reference. Since CIC interpolation filters are well known in the art, only those details that are necessary to understand the features and advantages of the invention are discussed.

Unlike conventional CIC interpolation filters, however, CIC interpolation filter 104 also includes an overflow detection circuit 216, an automatic reset circuit 218, and a reset hold circuit 220 in accordance with the invention. As such, CIC interpolation filter 104 is automatically reset once an overflow condition is detected, thereby providing prompt and ensured filter recovery.

In operation, samples (125 MHz) are sent (over bus 114) to comb (1) filter 200 for processing. The output samples of comb (1) filter 200 are sent (over bus 206) to comb (2) filter 200 for further processing. Similarly, the output of each successive comb filter 200 is sent to the next, with comb (N) filter 200 sending (over data bus 206) its processed samples to zero pad circuit 202.

Figure 3:
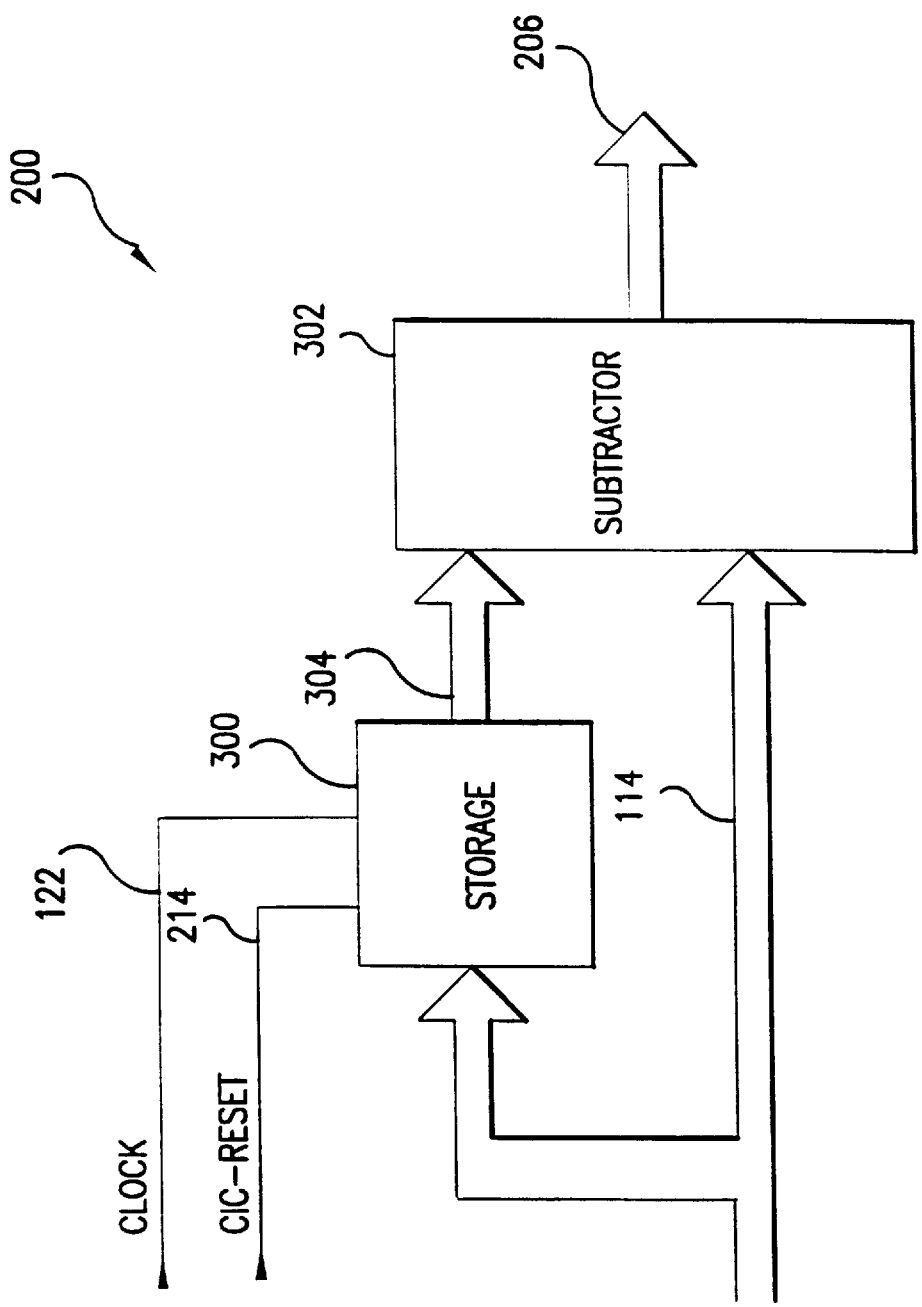
FIG. 3 is a detailed block diagram of a comb filter 200.

A detailed block diagram of comb filter 200 is illustrated in FIG. 3. Comb filter 200 includes a resettable storage element 300 and a subtractor circuit 302. In this embodiment storage element 300 is a single word register. In operation, for each cycle of clock 122, storage element 300 stores the current sample presented on its input data bus 114/206. Concurrently, subtractor circuit 300 subtracts the output of storage element 300 (which is the value of the previous sample) from the current sample. In general, the sample (word) size for storage element 300 and subtractor 302 must be at least ($B_{in}$+$\log_2 N$) bits, where $B_{in}$ is the number of bits per sample into a CIC interpolation filter. In this embodiment, since $B_{in}$=16 and N=4 these element must have at least 18 bits.

In addition, storage element 300 is cleared with the assertion of CIC-reset 214. An alternate preferred embodiment of comb filter 200 has a storage element without an individual reset feature. In such an embodiment, storage element of comb filter 200 is cleared by "flushing" the CIC interpolation filter. That is, data bus 114 is cleared (set to value of zero) and CIC-reset 214 is held asserted for enough clock cycles to allow zero data to propagate throughout the comb storage elements.

Figure 4:
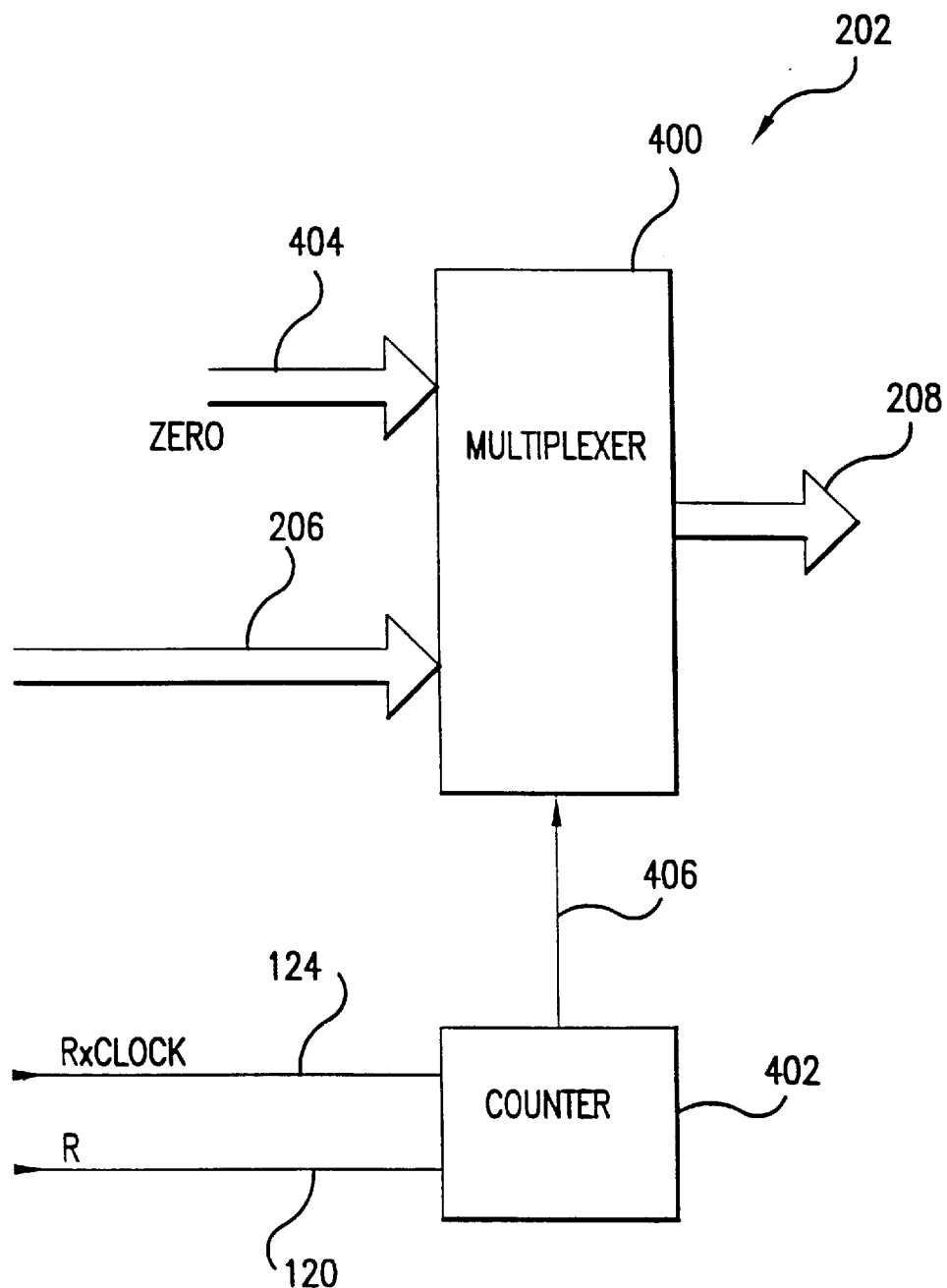
FIG. 4 is a detailed block diagram of a zero pad circuit 202.

FIG. 4 illustrates a detailed block diagram of zero pad circuit 202. Zero pad circuit 202 includes a 2:1 multiplexer 400 and a binary counter 402. In operation, multiplexer 400 passes onto bus 208 either the samples (on bus 206) or a zero value 404. Multiplexer 400 is controlled by counter 402 which generates a multiplexer control signal 406. Counter 402 is clocked by Rxclock 124 and programmed (over bus 120) with the interpolation factor (R). For every "R" cycles of Rxclock 124, counter 402 asserts multiplexer control signal 406 to select the sample on bus 206 for one cycle. For the remaining "R−1" cycles, counter 402 asserts control signal 406 to select zero value 404. As would be apparent to one skilled in the art, multiplexer 400 can alternately be implemented with an "AND" gate circuit to set bus 206 to a zero value for each "R−1" cycles.

The output samples of zero pad circuit 202 are sent (over bus 208) to integrator (1) 204 for further processing. The output samples of integrator (1) 204 are passed (over bus 210) to integrator (2) 204. Similarly, the output samples of each successive integrator circuit 204 are sent to the next for further processing, with integrator (N) 204 sending its output samples (50 MHz) onto bus 116.

Figure 5:
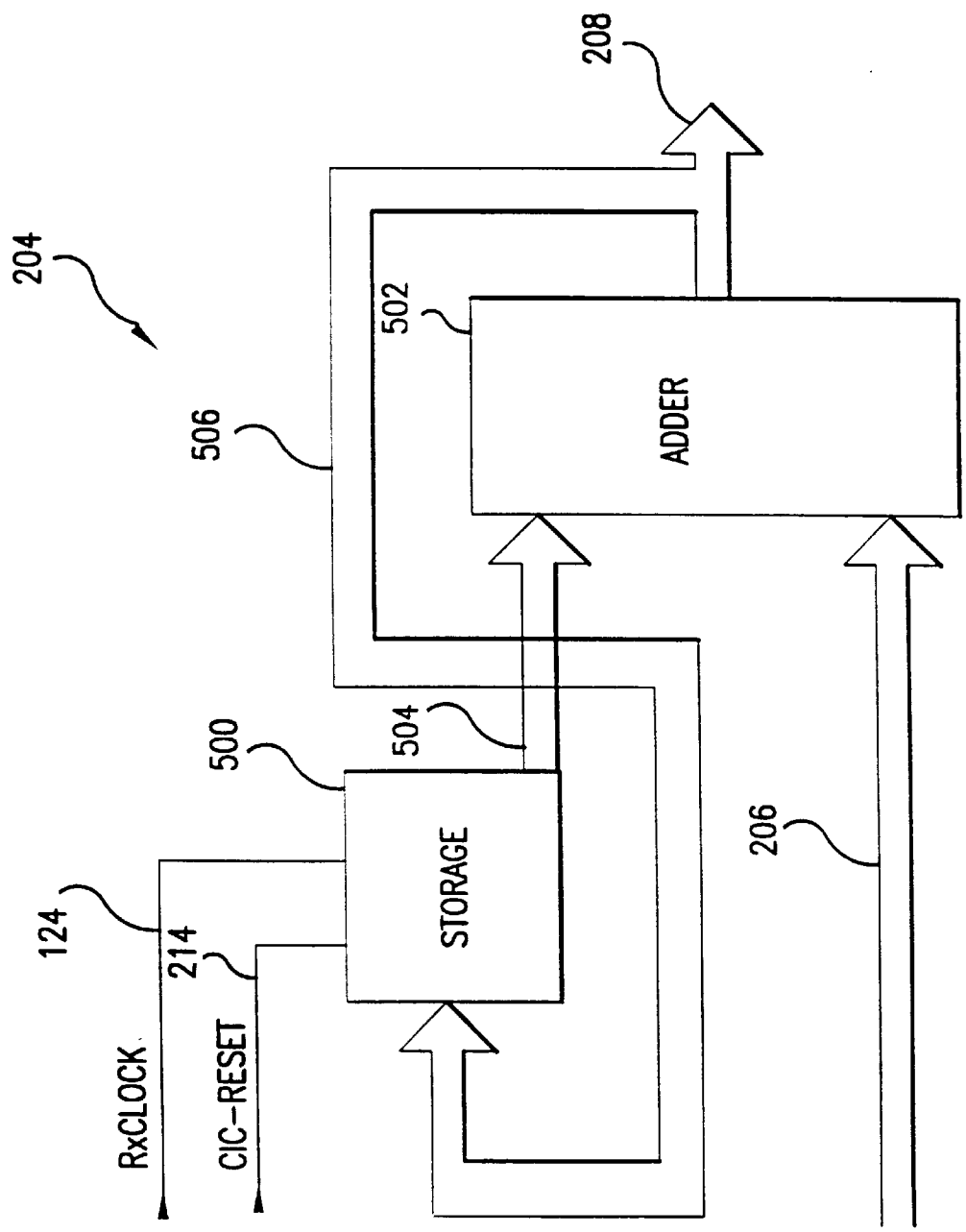
FIG. 5 is a detailed block diagram of an integrator circuit 204.

FIG. 5 illustrates a detailed block diagram of integrator circuit 204. Integrator circuit 204 includes a resettable storage element 500 and an adder circuit 502. In this embodiment, storage element 500 is a single word register. In operation, for each cycle of Rxclock 124, storage element 500 stores the current sample presented on data bus 206. Concurrently, adder circuit 502 adds the output (on bus 504) of storage element 500 (which is the value of the previous output sample of adder 500) to the current sample.

CIC-reset 214 causes storage element 500 to clear its contents and set its output to zero. An alternate embodiment of integrator circuit 204 has a clear circuit (on either bus 504 or bus 506) between storage 500 and adder 502 to clear storage element 500.

Conventionally the sample (word) size for each storage element 500 and adder circuit 502 must be at least ($B_{in}$+$\log_2 R^{(N-1)}$) bits. However, this embodiment, in accordance with the invention, has at least (1+$B_{in}$+$\log_2 R^{(N-1)}$) bits to allow for overflow detection. As such, this embodiment uses a sample size of 59 (i.e., 1+16+$\log_2 400^{(4-1)}$) bits in integrator (N) 204.

This additional bit is utilized by overflow circuit 216 to detect filter instability. In operation, overflow circuit 216 monitors the samples sent on bus 116 by integrator (N) 204 and checks an overflow condition. If an overflow condition is detected, overflow circuit 216 asserts an auto-reset signal 222.

Figure 6:
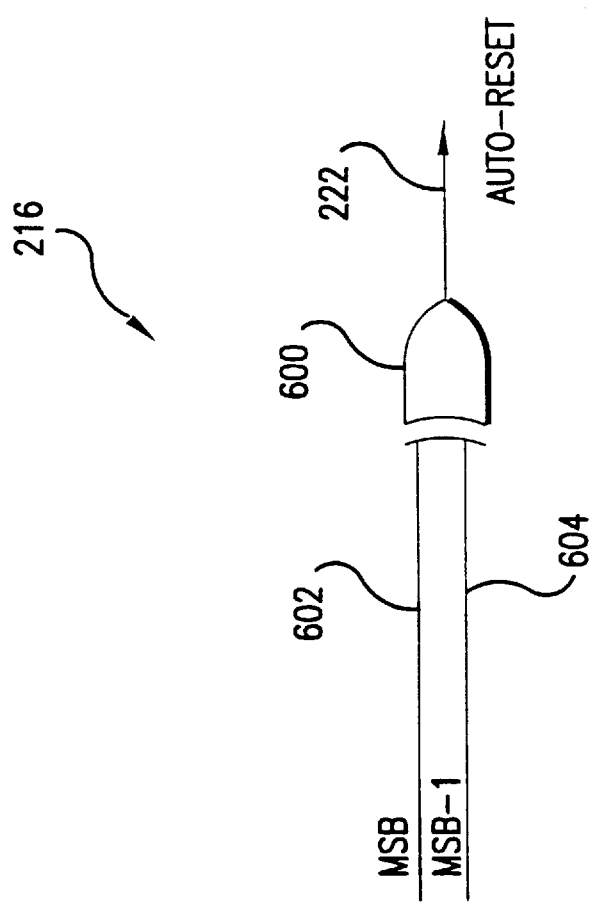
FIG. 6 is a detailed block diagram of an overflow detect circuit 216.

FIG. 6 illustrates a detailed block diagram of overflow circuit 216. Since this embodiment utilizes sign-2's-complement arithmetic, overflow circuit 216 is a simple exclusive-OR (XOR) gate 600. The inputs to XOR gate 600 are the two most significant bits (MSBs) of bus 116, MSB 602 (bit 58 in this embodiment) and MSB-1 604 (bit 57 in this embodiment). MSB-1 604 is the 2's-complement sign bit and MSB 602 is an "extra" 2's-complement sign bit. The remaining bits of bus 116 (MSB-2 to LSB; or bits 56-0 in this embodiment) are used for sample data.

An overflow condition is detected by monitoring both MSB 602 and MSB-1 604. Under normal conditions, both bits have the same value (i.e., "00" or "11"). When CIC interpolation filter 104 is unstable, overflow conditions occur and these bits do not have the same values (i.e., "01" or "10"). Accordingly, exclusive-OR gate 600 asserts autoreset signal 222 when an overflow is detected, thereby automatically and promptly recovering CIC interpolation filter 104 without requiring system level intervention.

Figure 7:
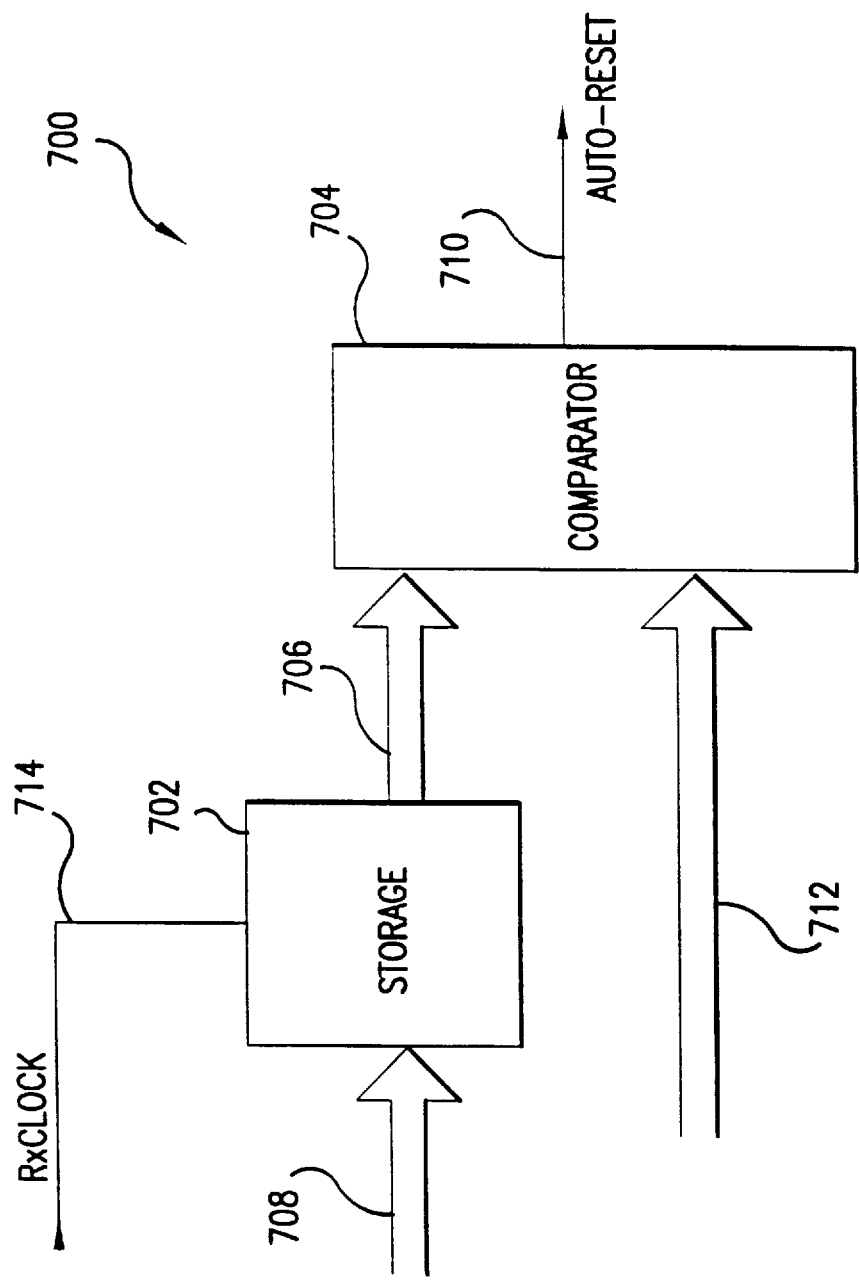
FIG. 7 is a detailed block diagram of an overflow detect circuit 700.

While FIG. 6 illustrates the overflow circuit for this embodiment of the invention, other implementations would be apparent to one skilled in the art. For example, FIG. 7 illustrates an alternate embodiment of an overflow circuit 700 which is included in a CIC interpolation filter similar to CIC interpolation filter 104 illustrated in FIG. 2. In this embodiment, overflow circuit 700 includes a storage element 702 and a comparator circuit 704. Storage element 702 is a single word register having a word width of approximately ($B_{in}$+$\log_2 R^{(N-1)}$) bits.

In operation, the output sample on bus 712 (similar to bus 116) is compared with output 706 of storage register 702. Although all the bits of the output sample are compared in this embodiment, it would be apparent to one skilled in the art that only a predetermined number of MSBs are required, in many applications, to make the comparison. When the output sample exceeds output 706 of storage register 702, comparator circuit 704 asserts auto-reset signal 710 (similar to auto-reset 222) to indicate an overflow condition and thus filter instability. The communication system in this embodiment initializes storage register 702, over data bus 708, with a predetermined threshold governed by $A(R^{(N-1)})$, where A is the maximum amplitude (magnitude) of the input samples to CIC interpolation filter 104.

Returning now to the embodiment illustrated in FIG. 2, auto-reset signal 222 is combined with system reset 118 at reset circuit 218 (which is a simple OR gate in this embodiment). As previously discussed, system reset 118 allows the communication system force a reset condition and recover the filter after a change in filter parameters (e.g., interpolation factor "R"). Auto-reset signal 222, in contrast, is generated "automatically" within CIC interpolation filter 104 to recover from instabilities cause by random noise. When either, or both, of these reset signals are asserted, reset circuit 218 asserts a filter reset signal 224. Alternatively, CIC interpolation filter 104 can be implemented without reset circuit 218. That is, since overflow circuit 216 automatically detects all filter instabilities (caused by random noise as well as changes in filter parameters), having a system reset capability (via system reset 118) may not be required in some applications. In such instances, auto-reset signal 222 is input directly into reset hold circuit 220.

In this embodiment, reset hold circuit 220, in response to filter reset signal 224, asserts CIC-reset 214 for a predetermined number of clock cycles to guarantee that CIC interpolation filter 104 is fully reset. However, as would be apparent to one skilled in the art, utilization of a reset hold circuit is not necessary in those implementations in which the CIC interpolation filter is fully reset in approximately one cycle of Rxclock 124.

Figure 8:
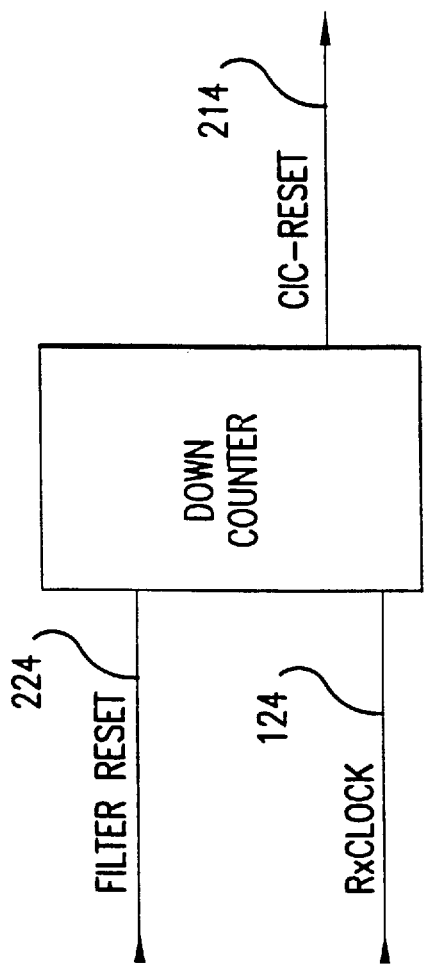
FIG. 8 is a detailed block diagram of a reset hold circuit 220.

FIG. 8 illustrates a detailed block diagram of reset hold circuit 220 in accordance with this embodiment. Reset hold circuit 220 includes a down counter 800 that is hardwired for a predetermined count. When filter reset signal 224 is asserted, down counter 800 is enabled and CIC-reset 214 is asserted. Down counter 800 maintains CIC-reset 214 in its asserted state while it counts down toward zero. Once the zero count is reached, down counter 800 releases CIC-reset 214 and reloads the predetermined count. Down counter 800, however, can be programmable, rather than hardwired, to allow the communication system set the count value.

As would be appreciated by one skilled in the art, all these advantages of the invention can be realized at an insignificant cost since the various embodiments of the invention can be readily implemented with very simple combinational logic. Indeed, several embodiments of the invention would require less than 20–30 CMOS gates to implement the overflow and reset circuits.

Method and Process

Figure 9:
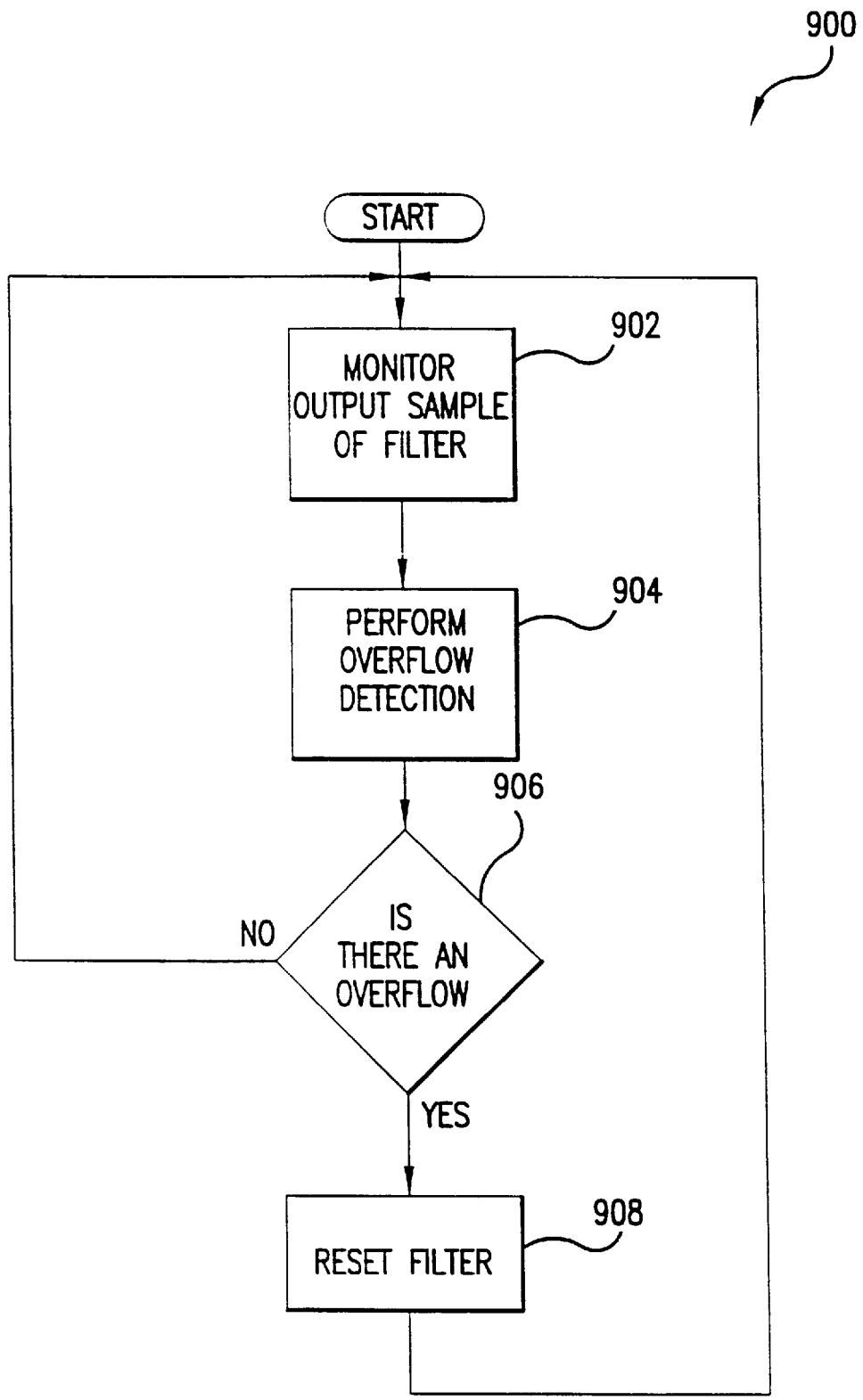
FIG. 9 is a flow diagram of a method 900 for detecting filter instabilities and automatically resetting a CIC interpolation filter in accordance with the principles of the invention.

FIG. 9 is a flow diagram illustrating a method 900 of detecting instabilities and resetting a CIC interpolation filter in accordance with the principles of the invention. During step 902, the output of the CIC interpolation filter is monitored for a next output sample. In step 902, overflow detection is performed. As discussed above, there are several techniques of performing overflow detection. In this embodiment, step 902 compares the value of the output sample with a predetermined maximum threshold value.

In step 904, if no overflow condition is detected, the method returns to step 902 and waits for the next output sample. If, however, an overflow condition is detected, the CIC interpolation filter is reset in step 908. After resetting the filter, the method returns to step 902 and waits for the next output sample.

Additional Embodiments

In another embodiment of CIC interpolation filter 104, storage elements are added between or within comb circuits 200, or zero pad circuit 202, or integrator circuits 204. These additional storage elements may be added if they are necessary to decrease the timing delays between these circuits. If these storage elements are added, they must either have reset capabilities built-in, or the auto-reset signal 222 must be held active by reset hold circuit 220 for enough clock cycles to clear these additional storage elements.

As would be apparent to those skilled in the art, the invention can be implemented with discrete commercially available circuits on a printed circuit board, rather than with application specific integrated circuit (ASIC) library components/cells, as discussed above. Similarly, the invention can be readily implemented in software or firmware for a general purpose digital signal processor or system.

While the invention has been particularly shown and described with reference to several preferred embodiments thereof, it will be understood by those skilled in the art that various changes in form and details may be made therein without departing from the spirit and scope of the invention as defined in the appended claims.

What is claimed is:

1. A signal processing system, comprising:
   interpolation means for processing input samples and outputting output samples; and
   overflow detector means for detecting an overflow condition, wherein said overflow detector means monitors said output samples and asserts an auto-reset signal if said overflow condition is detected,
   wherein said overflow detector means includes an exclusive-OR means for receiving two most significant bits of each of said output samples and said overflow detector means asserts said auto-reset if said two most significant bits are not of a same value.

2. The signal processing system of claim 1, further comprising reset means for asserting a reset signal in response to said auto-reset signal, wherein said interpolation means is reset in response to said reset signal.

3. The signal processing system of claim 2, wherein said reset means maintains said reset signal asserted for a predetermined period.

4. The signal processing system of claim 3, wherein said reset means includes programmable counter means for maintaining said reset signal for said predetermined period.

5. The signal processing system of claim 2, wherein said reset means is responsive to a system reset signal and said reset means asserts said reset signal when said system reset signal is asserted.

6. The signal processing system of claim 2, wherein said interpolation means includes first storage means for storing one of said input samples and second storage means for storing one of said output samples, and said first and second storage means are reset in response to said reset signal.

7. The signal processing system of claim 1, wherein the signal processing system is a cellular communication system.

8. The signal processing system of claim 1, wherein the signal processing system is a digital transmit circuit.

9. The signal processing system of claim 1, wherein said interpolation means comprises:
   a comb filter;
   a zero pad circuit; and
   an integrator,
   wherein said comb filter, said zero pad circuit, and said integrator are operably connected to process said input samples and output said output samples.

10. The signal processing system of claim 9, wherein said comb filter and said integrator each have N stages, where N is greater than 1.

11. The signal processing system of claim 1, further comprising a transmission filter means for interpolating samples and outputting said input samples.

12. The signal processing system of claim 1, further comprising:
   oscillator means for providing a signal; and
   mixing means for mixing said output samples with said signal.

13. A signal processing system, comprising:
   interpolation means for processing input samples and outputting output samples, wherein said interpolation means is a cascaded integrator-comb filter, said input samples have $B_{in}$ bits, and said output samples have at least $(1+B_{in}+\log_2 R^{(N-1)})$ bits, wherein R is the interpolation factor and N is the number integrator-comb stages: and
   overflow detector means for detecting an overflow condition, wherein said overflow detector means monitors said output samples and asserts an auto-reset signal if said overflow condition is detected.

14. The signal processing system of claim 13, wherein N is approximately 3.

15. The signal processing system of claim 13, wherein N is approximately 5.

16. A signal processing system, comprising:
   interpolation means for processing input samples and outputting output samples; and
   overflow detector means for detecting an overflow condition, wherein
   said overflow detector means monitors said output samples and asserts an auto-reset signal if said overflow condition is detected, and said overflow detector means includes register means for storing a predetermined threshold value and comparator means for comparing said predetermined threshold value with the value of each of said output samples, and said overflow detector means asserts said auto-reset signal if the value of one of said output samples is greater than said predetermined threshold value, and wherein said predetermined threshold value is approximately $A(R^{(N-1)})$, wherein A is the maximum value of said input samples, R is the interpolation factor, and N is the number of integrator-comb stages.

17. A system for use with an interpolation filter, wherein the interpolation filter outputs output samples and is reset in response to a reset signal, the system comprising:

an overflow detector having an auto-reset signal and operably connected to monitor the output samples, wherein said overflow detector asserts said auto-reset signal if an overflow condition is detected, wherein said overflow detector comprises an exclusive-OR gate that receives two most significant bits of each of the output samples and said overflow detector asserts said auto-reset signal if said two most significant bits are not of a same value; and a reset circuit for asserting the reset signal in response to said auto-reset signal.

18. The system of claim 17, wherein the system is a communication system.

19. A system for use with an interpolation filter, wherein the interpolation filter outputs output samples and is reset in response to a reset signal, the system comprising:

an overflow detector having an auto-reset signal and operably connected to monitor the output samples, wherein said overflow detector asserts said auto-reset signal if an overflow condition is detected; and a reset circuit for asserting the reset signal in response to said auto-reset signal, wherein the interpolation filter comprises a cascaded integrator-comb filter that receives input samples, each having $B_{in}$ bits, and outputs the output samples, each having at least $(1+B_{in}+\log_2 R^{(N-1)})$ bits, wherein R is the interpolation factor and N is the number integrator-comb stages.

20. The system of claim 19, wherein N is approximately 4.

21. The system of claim 19, wherein said overflow detector comprises an exclusive-OR gate that receives two most significant bits of each of the output samples.

22. A method for automatically resetting an interpolation filter, the method comprising the steps of:

monitoring two most significant bits of an output sample from the interpolation filter;

performing overflow detection on said output sample, wherein said performing step includes performing an exclusive-OR function with said two most significant bits and wherein an overflow condition occurs when said two most significant bits are not of a same value; and resetting the interpolation filter if said overflow condition is detected.

23. The method of claim 22, wherein said resetting step maintains the interpolation filter in reset for a predetermined period.

* * * * *